United States Patent
Tsai et al.

(10) Patent No.: US 6,444,566 B1
(45) Date of Patent: Sep. 3, 2002

(54) METHOD OF MAKING BORDERLESS CONTACT HAVING A SION BUFFER LAYER

(75) Inventors: Ming Huan Tsai, Chu-pei; Jyh Huei Chen, Hsin-Chu; Chu Yun Fu, Taipei; Hun Jan Tao, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/845,481

(22) Filed: Apr. 30, 2001

(51) Int. Cl.$^7$ .................... H01L 21/4763; H01L 21/302
(52) U.S. Cl. ................. 438/624; 438/586; 438/634; 438/637; 438/706; 438/735; 438/738; 438/740; 438/744
(58) Field of Search ................... 438/585, 586, 438/622, 628, 634, 637–641, 706, 710, 723, 724, 735, 738, 740, 743, 744

(56) References Cited

U.S. PATENT DOCUMENTS 5,677,231 A * 10/1997 Maniar et al. ............. 437/67
6,017,826 A * 1/2000 Zhou et al.
6,072,237 A * 6/2000 Jang et al. ............... 257/698
6,083,824 A * 7/2000 Tsai et al. ................ 438/629
6,110,278 A * 8/2000 Chien et al. .............. 438/675
6,133,105 A * 10/2000 Chen et al. ............... 438/296
6,297,162 B1 * 10/2001 Jang et al.
6,316,348 B1 * 11/2001 Fu et al.

* cited by examiner

Primary Examiner—Ha Tran Nguyen
(74) Attorney, Agent, or Firm—George O. Saile; Stephen B. Ackerman

(57) ABSTRACT

Borderless contacts are used in integrated circuits in order to conserve chip real estate. As part of the process for manufacturing borderless contacts, an etch-stopping layer of silicon nitride is first laid over the area that is to be contacted. Investigation has now shown that this can lead to damage to the silicon at the edges of the via. The present invention eliminates this damage by introducing a buffer layer between the silicon surface and said sidon nitride layer. Suitable materials for the buffer layer that have been found to be infective include silicon oxide and silicon oxynitride with the latter offering some ditional advantages over the former. Experimental data confirming the effectiveness of the buffer layer are provided, together with a process for its manufacture.

6 Claims, 3 Drawing Sheets

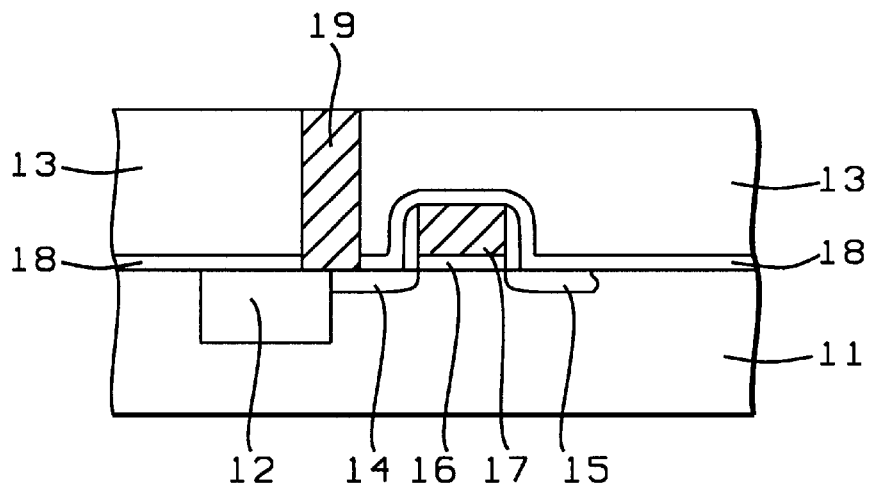
FIG. 1 - Prior Art
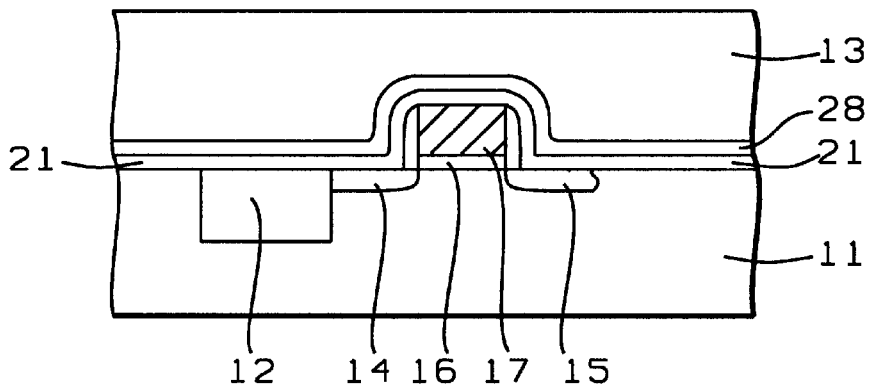
FIG. 2
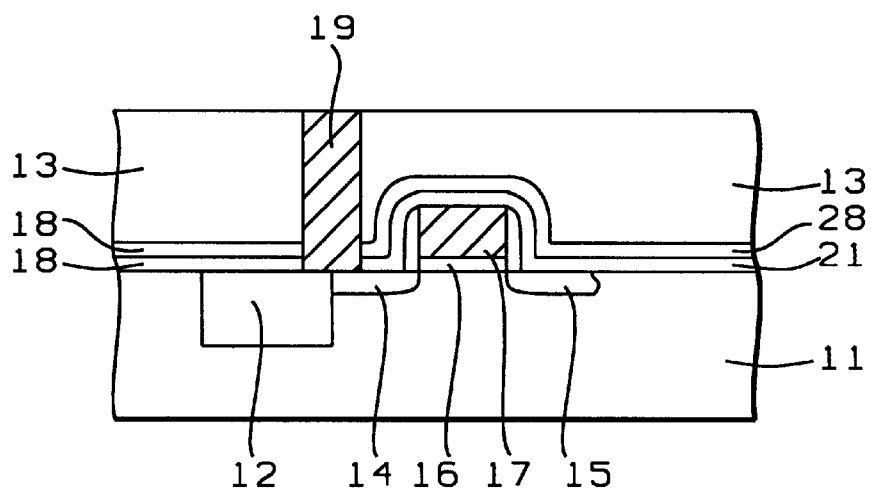
FIG. 3

METHOD OF MAKING BORDERLESS CONTACT HAVING A SION BUFFER LAYER

FIELD OF THE INVENTION

The invention relates to the general field of silicon integrated circuits with particular reference to interconnection technology, particularly borderless contacts.

BACKGROUND OF THE INVENTION

As component densities in integrated circuits continue to increase, ways are constantly being sought to make the most efficient use possible of all chip real estate. A particular example is the development of borderless contacts. In the prior art, it was standard to provide a border around all metal vias where they emerged at a surface. Such a border allowed a small amount of misalignment, relative to the next level of metalization to be tolerated.

FIG. 1 shows an example of a borderless contact, seen in schematic cross-section. Metal via 19 is intended to contact source (or drain) area 14 which is adjacent to insulation-filled shallow isolation trench 12. The detailed process for making the contact is described in the prior art (see, for example, Jang et al. in U.S. Pat. No. 6,072,237). Suffice it to say that an important part of this process is that an etch-stopping layer of silicon nitride 18 is first laid over the area that is to be contacted before the hole for via 19 is formed. This extra step allows said via hole to be substantially overetched while protecting the underlying material.

While the borderless contact process and structure work as intended, later work revealed that, at least in some cases, devices contacted through borderless contacts of the type shown in FIG. 1 were undergoing some performance degradation. Further investigation has shown that, even though the silicon nitride etch stop layer 18 is removed from the floor of the via hole before the via hole is filled with metal, damage to the silicon at the edges of the via was occurring in the form of dislocations that propagate downwards into the silicon. As is well known, such dislocations have a significant impact on device performance.

The problem to be solved by the present invention was therefore how to provide high quality borderless contacts without in any way impacting device performance.

As part of a routine search of the prior art, several other examples of borderless contacts were encountered. These were U.S. Pat. No. 6,133,105 (Chen et al.), U.S. Pat. No. 6,083,824 (Tsai et al.), and U.S. Pat. No. 5,677,231 (Maniar et al.). The use of an oxide layer as an etch stop layer is mentioned by Chien et al. in U.S. Pat. No. 6,110,827.

SUMMARY OF THE INVENTION

It has been an object of the present invention to provide a borderless contact for use in a silicon integrated circuit.

Another object has been that said contact be free of dislocations in the substrate at the interface between the contacting plug's edge and the silicon surface that it contacts.

A further object has been to provide a process for manufacturing said borderless contact.

These objects have been achieved by introducing a buffer layer between the silicon surface and the silicon nitride layer used as an etch stop layer during formation of the borderless contact. Suitable materials for the buffer layer that have been found include silicon oxide and silicon oxynitride. Experimental data confirming the effectiveness of the buffer layer are provided together with a process for its manufacture.

BRIEF DESCRIPTION OF THE DRAWINGS

FIG. 1 is an example of a borderless contact of the prior art.

FIG. 2 shows an intermediate stage in the manufacture of the structure disclosed in the present invention.

FIG. 3 shows a borderless contact made according to the teachings of the present invention.

DESCRIPTION OF THE PREFERRED EMBODIMENTS

Figure 4:
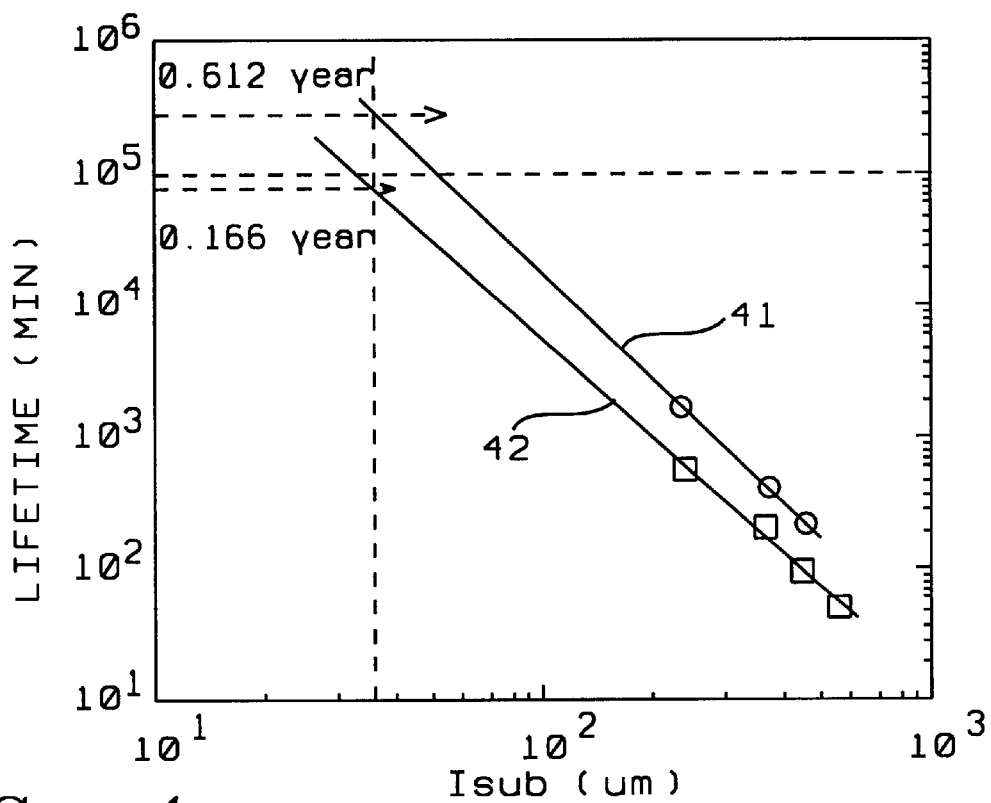
FIG. 4 is a plot of lifetime as a function of $1_{sub}$ for devices similar to that of FIG. 1 and for devices similar to that of FIG. 3.

We will describe the present invention in terms of a process for manufacturing it. In the course of this, the structure of the present invention will also become apparent. Referring now to FIG. 2, we show there silicon substrate 11 in whose upper surface a field effect transistor has been formed. This field transistor comprises source and drain regions 14 and 15, gate insulation layer 16, and gate pedestal 17, and is adjacent to insulation-filled shallow isolation trench 12.

In a key departure from the prior art, buffer insulation layer 21 has been laid down before the deposition of silicon nitride layer 28, as was the case for the prior art structure that is illustrated in FIG. 1. We have determined that either of two materials are suitable for use as said buffer layer. These are:

Silicon oxide: This is deposited by means of CVD (chemical vapor deposition) to a thickness between about 30 and 200 Angstroms; or Silicon oxynitride:. This is deposited by means of PE (plasma enhanced) CVD to a thickness between about 50 and 400 Angstroms.

However, as will become evident below, silicon oxynitride provides additional advantages relative to silicon oxide over and above its use for stress relief.

With layer 21 in place, silicon nitride layer 28 was deposited over it to a thickness between about 50 and 400 Angstroms. Dielectric layer 13 is then deposited onto silicon nitride layer 28 and is then patterned and etched, using standard photolithographic techniques, to form via hole 19, that extends though layer 13 as far as silicon nitride layer 28. The latter acts as an etch stop layer allowing considerable over-etching to occur as a normal part of the borderless contact formation process. Via hole 19 has a maximum width (diagonal or diameter) of between about 0.1 and 0.2 microns.

All silicon nitride is then selectively removed from the bottom of via hole 19. This was accomplished by using a hydrogen bearing plasma such as trifluoromethane, difluoromethane, or monofluoromethane, together with argon, oxygen and or carbon monoxide, following which any exposed portion of layer 21 was selectively removed from the bottom of via hole 18 so that the area that is to be contacted (in this example, source/drain area 14, although other contacting areas such as the gate, another via, etc. could also have been contemplated) is now fully exposed.

Selective removal of the silicon oxide or the silicon oxynitride layer was achieved by using a hydrogen bearing plasma such as trifluoromethane, difluoromethane, or monofluoromethane, together with argon, oxygen and carbon monoxide.

Finally, via hole 19 is. just filled with a suitable metal so as to form a plug that contacts the contacting area. Examples of a suitable metal include aluminum and tungsten. The completed structure then has the appearance illustrated in FIG. 3.

Confirmation of the effectiveness of the present invention was obtained by experiment. In FIG. 4 we show a plot of lifetime (mean time to failure under worst case conditions) as a function of 1 sub (substrate current) in micro-amps. Curve 41 is for borderless contacts made according to the teachings of the prior art whereas curve 42 is for borderless contacts in which a buffer layer of silicon oxynitride was inserted. By extrapolating back the lifetimes for the prior art and invention-based devices can be read off the curve to be 0.166 and 0.612 years respectively, demonstrating an improvement of almost 4 times for the device made according to the present invention.

Figure 5:
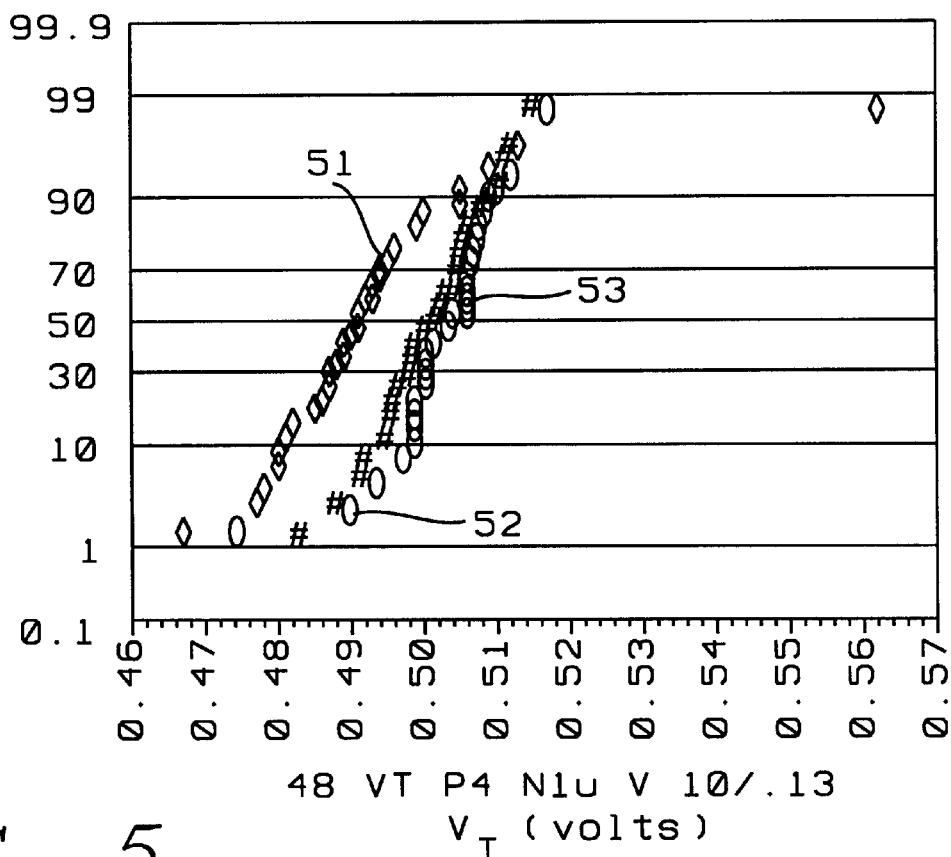
FIG. 5 is a plot of $V_T$ vs. distribution for devices similar to that of FIG. 1 and for devices similar to that of FIG. 3.

FIG. 5 is a plot of the percentage of devices on a split condition as a function of $V_T$ (threshold voltage). Curve 51 is for a device made according to the practices of the prior art while 52 and 53 are for devices in which layers of silicon oxynitride and silicon oxide, respectively, had been inserted between the silicon nitride etch stop layer and the contacting area. A wide range in the value of $V_T$ is undesirable because the device cannot then function as an efficient switch. As can be seen, such a spread is present for curve 51 but is greatly reduced for curves 52 and 53.

Figure 6:
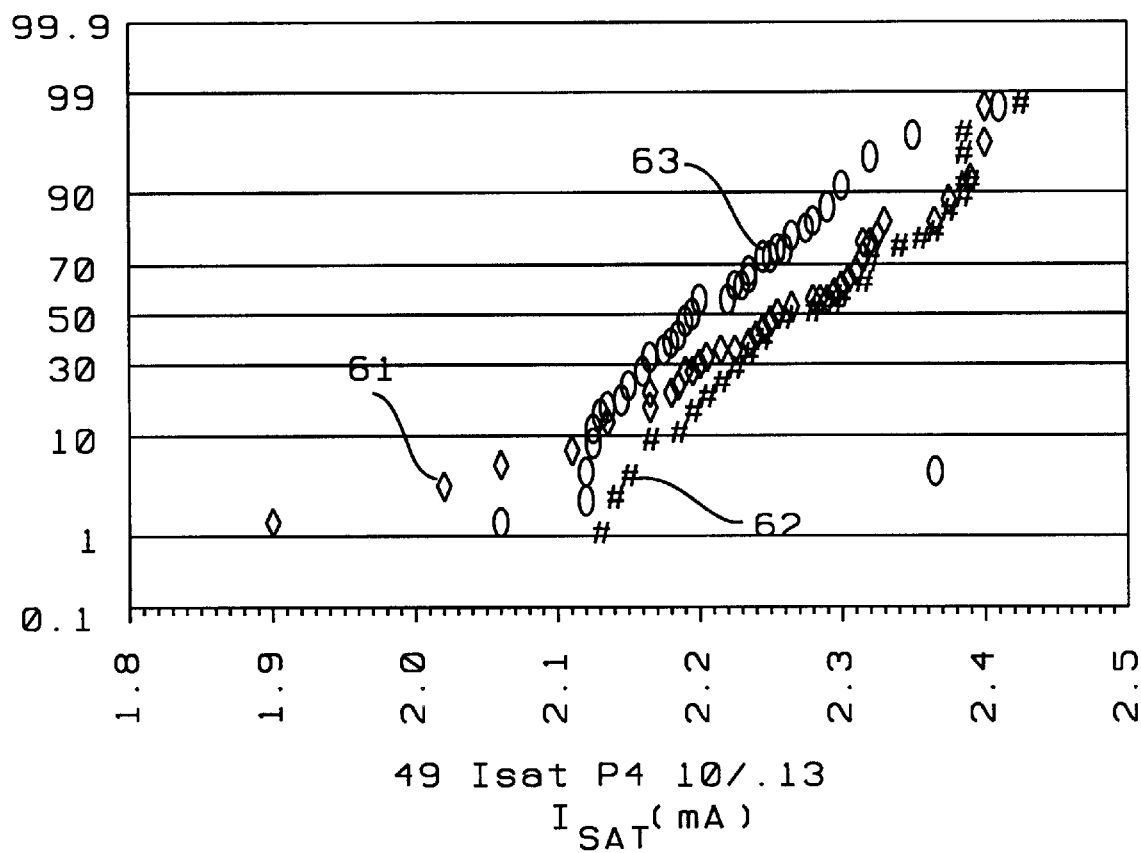
FIG. 6 is a plot of $1_{dsat}$ VS. distribution for devices similar to that of FIG. 1 and for devices similar to that of FIG. 3.

FIG. 6 is a plot of devices on a split condition as a function of Isat (saturation current). Curve 61 is for a device made according to the practices of the prior art while 62 and 63 are for devices in which layers of silicon oxynitride and silicon oxide, respectively, had been inserted between the silicon nitride etch stop layer and the contacting area. The extension of curve 61 to values of at less than about 2.1 mA indicates that the devices will have poor performance. As can be seen, this is not the case for curves 52 and 53.

It should be noted that the substitution of silicon oxynitride for silicon oxide, as the buffer layer between silicon nitride and silicon, provides additional advantages beyond those associated with the conventional pad oxide that is practiced by the prior art:

(1) Use of silicon oxynitride allows the thickness of the silicon nitride to be reduced to a greater extent than if a pure oxide layer is used for stress relief (as in the prior art). Reducing the thickness of the silicon nitride is greatly advantageous since its dielectric constant is about 3 times that of the oxynitride, so even if the total thickness of the two layers remains unchanged, parasitic capacitance associated with these two layers will be reduced.

(2) Reducing the silicon nitride thickness in this way is possible because, should the (thinner) silicon nitride layer be penetrated (i.e. not act as a perfect etch stop layer), the underlying silicon oxynitride layer can then act as a backup etch stop layer since it is attacked much more slowly by the via hole etchant than is the main oxide layer through which the via hole is being formed.

While the invention has been particularly shown and described with reference to the preferred embodiments thereof, it will be understood by those skilled in the art that various changes in form and details may be made without departing from the spirit and scope of the invention.

What is claimed is:

1. A process for forming a borderless contact to a contacting area on a silicon surface, comprising the sequential steps of:

depositing a buffer layer of silicon oxynitride over said silicon surface, including said contacting area;

depositing a layer of silicon nitride on said layer of silicon oxynitride;

depositing a dielectric layer on said layer of silicon nitride;

patterning and etching said dielectric layer to form a via hole, having a first bottom, that extends as far as said layer of silicon nitride;

selectively removing all silicon nitride from the first bottom of the via hole, thereby forming a second bottom;

selectively removing all silicon oxynitride from the second bottom of the via hole, thereby exposing the contacting area; and filling the via hole with a metal plug that contacts the contacting area.

2. The process described in claim 1 wherein said contacting area is selected from the group consisting of source, drain, and gate.

3. The process described in claim 1 wherein said layer of silicon oxynitride is deposited by means of PECVD to a thickness between about 50 and 400 Angstroms.

4. The process described in claim 1 wherein said layer of silicon nitride is deposited to a thickness between about 50 and 400 Angstroms whereby parasitic capacitance is reduced.

5. The process described in claim 1 wherein the step of selectively removing all silicon nitride from the first bottom of the via hole further comprises using a hydrogen bearing plasma selected from the group consisting of trifluoromethane, difluoromethane, and monofluoromethane, together with argon, oxygen and carbon monoxide.

6. The process described in claim 1 wherein the step of selectively removing all silicon oxynitride from the second bottom of the via hole further comprises using a hydrogen bearing plasma selected from the group consisting of trifluoromethane, difluoromethane, and monofluoromethane, together with argon, oxygen and carbon monoxide.

* * * * *